(12) United States Patent
Bandiziol

(10) Patent No.: US 11,856,082 B2
(45) Date of Patent: Dec. 26, 2023

(54) WIDESPREAD EQUISPATIATED PHASE GENERATION OF A CLOCK DIVIDED BY A NON-INTEGER FACTOR

(71) Applicant: Infineon Technologies AG, Neubiberg (DE)

(72) Inventor: Andrea Bandiziol, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/552,490

(22) Filed: Dec. 16, 2021

(65) Prior Publication Data

US 2023/0198733 A1   Jun. 22, 2023

(51) Int. Cl.

| | |
|---|---|
| H04L 27/00 | (2006.01) |
| H04L 7/033 | (2006.01) |
| H03K 5/00 | (2006.01) |
| G06F 1/10 | (2006.01) |
| H03K 3/037 | (2006.01) |
| H04L 7/00 | (2006.01) |

(52) U.S. Cl.
CPC .............. *H04L 7/0331* (2013.01); *G06F 1/10* (2013.01); *H03K 3/037* (2013.01); *H03K 5/00006* (2013.01); *H04L 7/0083* (2013.01)

(58) Field of Classification Search
CPC . H04L 7/0331; H04L 7/0083; H03K 5/00006; H03K 3/037; H03K 5/249; H03K 21/026; G06F 1/10
USPC ....... 375/259, 281, 280, 324, 329, 332, 316, 375/340
See application file for complete search history.

(56) References Cited

U.S. PATENT DOCUMENTS

| | | | | |
|---|---|---|---|---|
| 2018/0123575 A1* | 5/2018 | Huang | ................. | H03K 21/026 |
| 2022/0166451 A1* | 5/2022 | Kang | .................... | H03K 5/249 |

* cited by examiner

*Primary Examiner* — Phuong Phu
(74) *Attorney, Agent, or Firm* — Lowenstein Sandler LLP

(57) ABSTRACT

Apparatuses and methods of widespread equispatiated phase generation of a clock divided by a non-integer factor are described. One integrated circuit includes a clock divider and a phase generator. The clock divider receives a single-phase clock signal from a clock source and generates a divided clock signal. The phase generator receives the divided clock signal and the single-phase clock signal and generates multiple phase signals using the divided clock signal and the single-phase clock signal. The phase signals are equispatiated.

15 Claims, 12 Drawing Sheets

WIDESPREAD EQUISPATIATED PHASE GENERATION OF A CLOCK DIVIDED BY A NON-INTEGER FACTOR

TECHNICAL FIELD

The present disclosure generally relates to phase signal generation, particularly widespread equispatiated phase generation of a clock divided by a non-integer factor.

BACKGROUND

Certain applications, such as oversampling c recovery (CDR) circuits, use multi-phase clock signals for recovering clock signals and/or data signals. The multiple phase signals should be as equispatiated as possible. The original clock used in such applications might be derived from a higher-frequency clock used by a central processing unit (CPU). The divided clock might be provided from a clock source external to the oversampling CDR circuits. The original clock is typically a single-phase clock provided to an integrated circuit; thus, the various equispatiated phases are generated within an integrated circuit containing the CDR.

Conventional solutions usually generate the multiple phase signals locally from a single-phase clock using a delay-locked loop (DLL), a delay line, or an in-phase-quadrature (IQ) divider with multiple phase interpolators (PIs). The DLL can receive a single-phase, low-frequency clock and generate a number of phases from the single-phase, low-frequency clock. If the requirements are not too stringent, the delay line can be used instead. Alternatively, if a high-speed clock is available, an IQ divider can generate multiple phase signals from the single-phase, low-frequency clock and feed the obtained phases into a number phase interpolators equal to the number of wanted phases. The circuitry used for the DLL and IQ divider with multiple phase interpolator can consume significant power and require large areas for implementation.

DETAILED DESCRIPTION

As described above, conventional solutions usually generate the multiple phase signals locally from a single-phase clock using a DLL, a delay line, or an IQ divider with multiple phase interpolators. The circuitry used for the DLL and IQ divider with multiple phase interpolator implementations can consume significant power and require large areas.

In particular, the DLL requires a large amount of area for the circuitry to lock the DLL to a certain frequency, circuitry to provide biasing current, decoding circuitry, and a digital state machine to control the locking procedure. The locking procedure can take a non-negligible amount of time, leading to higher start-up times. In addition, the jitter of the various phase signals extracted from the DLL increases with the number of delay stages that the input signal passes through before coming out of the DLL. Also, a DLL is usually capable of locking only a specified frequency, and the locking range is usually between 2 and 3 for clock division.

Compared to the DLL, the delay line can improve power consumption, area, and start-up time. The problem with the delay line solution is that the spread of delays over the production validation testing (PVT) corners might be unacceptable for the application requirements. Also, the delay line can cause higher phase noise by not having a locked reference, increasing the jitter that accumulates over the number of phases generated by the DLL.

The solution with an IQ divider and multiple phase interpolators occupies the most area and consumes the most power among the three solutions mainly because, for each phase to be generated, a phase interpolator must be placed in the final design. It should also be noted that this solution uses a bias current for the phase interpolators, so it may not be very well suited for a digital domain or synthesizing by digital layout tools.

Aspects of the present disclosure address the deficiencies above by providing a low-area, low-power, wideband, all-digital solution for generating equispatiated phases out of a single-phase divided clock using the single-phase divided clock and a high-speed clock from which the single-phase divided clock is derived. Aspects of the present disclosure can use a single-phase divided clock and a positive phase and a negative phase of a high-frequency clock from which the single-phase divided clock is derived. Aspects of the present disclosure can solve the problems above for applications that feature a division ratio, as expressed in the following equation, between a high-frequency clock and a low-frequency clock.

$$\text{Division rate} = (2N+1)/2 \text{ (with } N=\{1,2,3 \ldots \}) \quad (1)$$

The division rate can be any non-integer factor, such as 1.5, 2.5, 3.5, and so on. Aspects of the present disclosure do not require the divided clock to have a 50% duty cycle and embodiments may deliver a solution with a low chip area requirement for implementation and a low power consumption.

Figure 1:
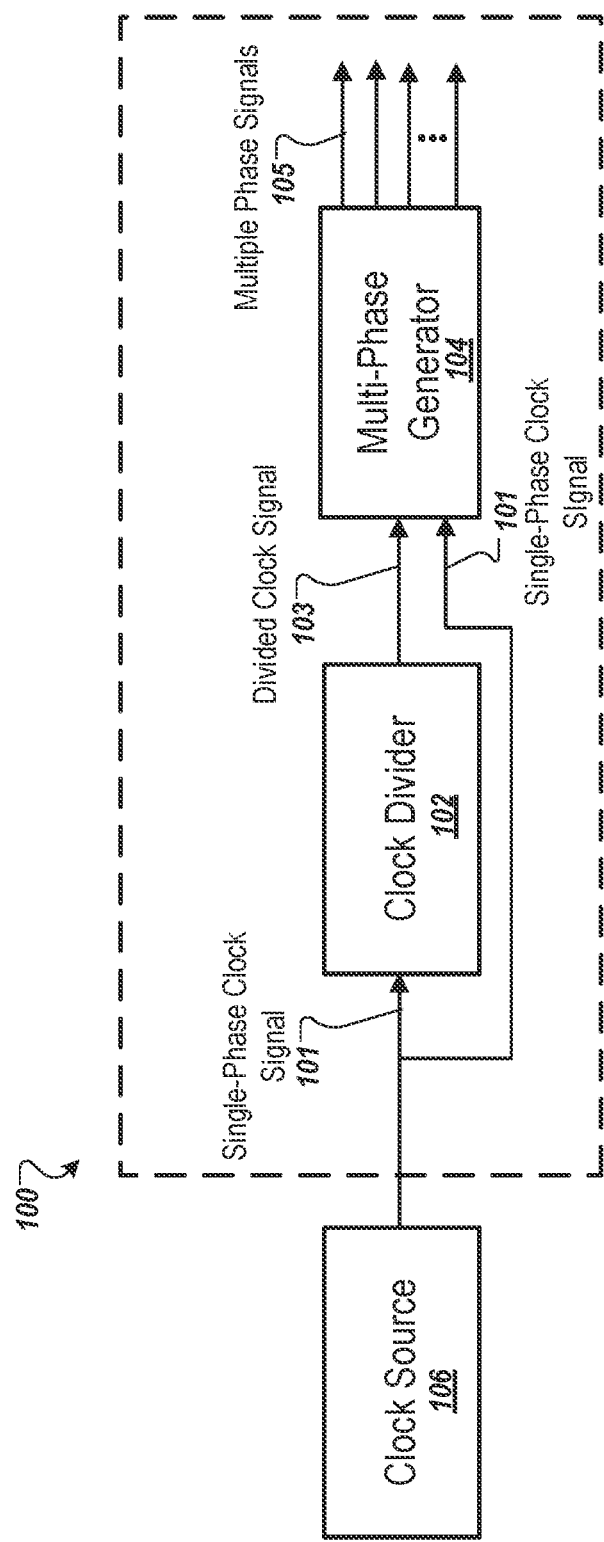
FIG. 1 is a block diagram of an integrated circuit with a clock divider and a multi-phase generator according to at least one embodiment.

FIG. 1 is a block diagram of an integrated circuit 100 with a clock divider 102 and a multi-phase generator 104 according to at least one embodiment. The clock divider 102 is coupled to a clock source 106. The clock divider 102 receives a clock divider to receive a single-phase clock signal 101 from the clock source 106. The clock divider 102 generates a divided clock signal 103. The single-phase clock signal 101 can be considered a high-frequency clock relative to the divided clock signal 103 that is a lower frequency clock. The single-phase clock signal 101 can be divided by a non-integer factor as expressed in equation (1) above. For example, the clock divider 102 can be a 1.5 clock divider that divides the single-phase clock signal 101 by 1.5 or a 2.5 clock divider that divides the single-phase clock signal 101 by 2.5. The multi-phase generator 104 is coupled to the clock divider 102. The multi-phase generator 104 receives the divided clock signal 103 and the single-phase clock signal 101 from which the divided clock signal 103 is derived. In another embodiment, the multi-phase generator 104 receives the divided clock signal 103, a positive phase of the single-phase clock signal 101, and a negative phase of the single-phase clock signal 101.

The multi-phase generator 104 generates a set of phase signals 105 using the divided clock signal 103 and the single-phase clock signal 101. The phases of the set of phase signals 105 are equispatiated. That is, a first edge of each phase signal is evenly distributed from one another in phase (or in the phase domain). For example, if there are five phase signals in the set of phase signals 105, each first edge of the five phase signals are spaced evenly, such as at 0 degrees, 72 degrees, 144 degrees, 216 degrees, and 288 degrees. For another example, if there are three phase signals in the set of phase signals 105, the first edges of the five phase signals are spaced evenly, such as at 0 degrees, 120 degrees, and 240 degrees.

In some cases, the single-phase clock signal 101 is received by the multi-phase generator 104, and the multi-phase generator 104 uses a positive phase and a negative phase of the single-phase clock signal 101. In other cases, the multi-phase generator 104 receives the positive phase and negative phase of the single-phase clock signal 101 from the clock divider 102.

In at least one embodiment, the multi-phase generator 104 allows for multi-phase generation out of a single-phase divided clock, while at the same time feature low area usage for implementation and power consumption, since there is not a part of the circuit switching at the high-frequency clock (e.g., 101). The multi-phase generator 104 can be an all-digital circuit in at least one embodiment. The multi-phase generator 104 and the clock divider 102 are all-digital circuits in another embodiment. The multi-phase generator 104 (and the clock divider 102) can be synthesized from a standard cell library. The multi-phase generator 104 can be integrated into a digital synthesis flow.

The multi-phase generator 104 (and the clock divider 102) can be integrated in a digital synthesis flow in at least one embodiment. In at least one embodiment, the multi-phase generator 104 does not require a 50% duty cycle out of the set of phase signal 105. The multi-phase generator 104 inherently produces phases that do not have a 50% duty cycle. It should be noted that a nominal duty cycle at the output can fluctuate if the duty cycle of the single-phase clock signal 101 (e.g., high-frequency clock) differs from 50% as described herein. The multi-phase generator 104 is well suited for applications that only use a first edge (e.g., a rising edge) of the set of phase signals 105. The multi-phase generator 104 is well suited for applications for which area, power, and digital integration are important design factors.

Figure 2:
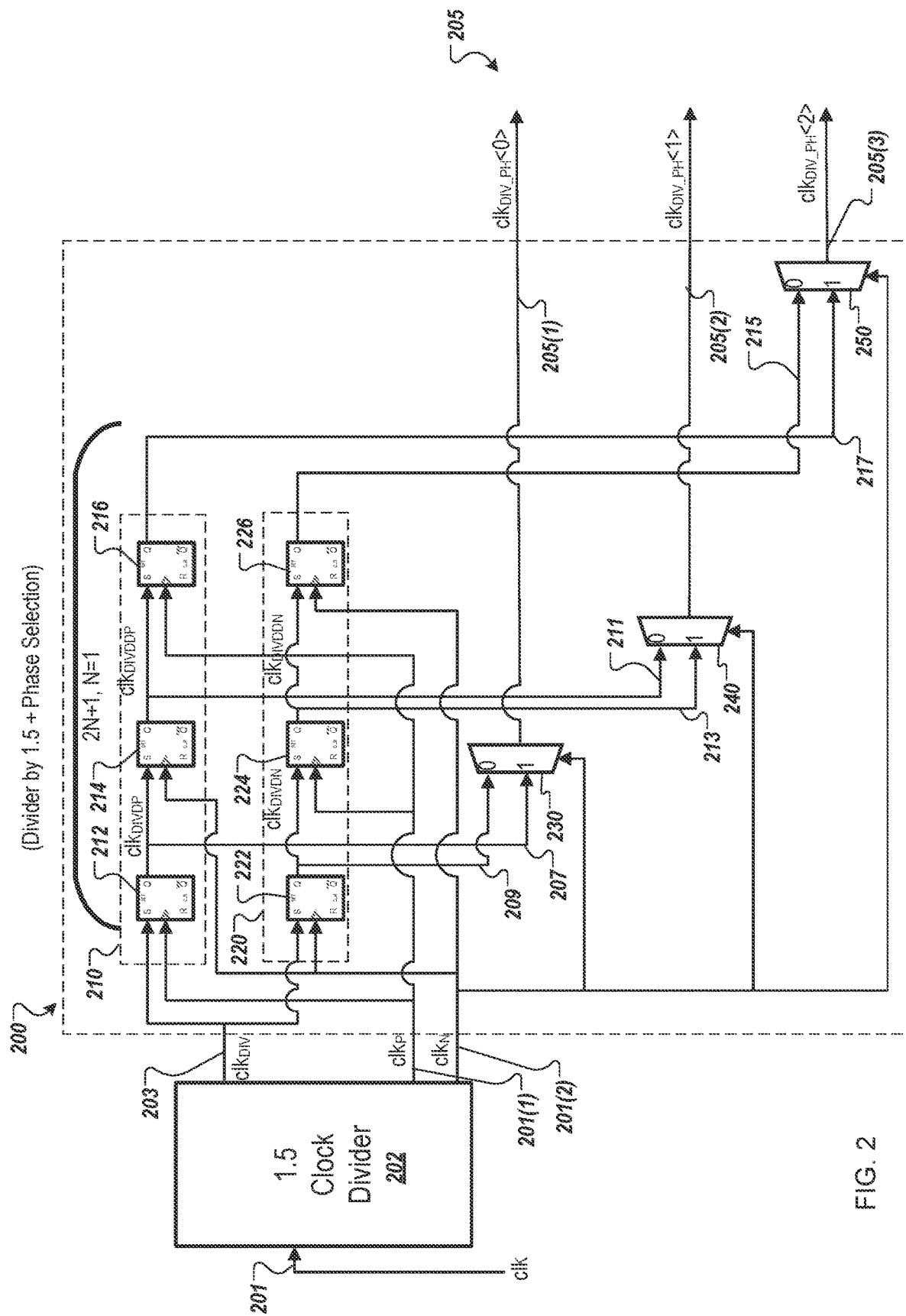
FIG. 2 is a block diagram of a multi-phase generator according to at least one embodiment.

FIG. 2 is a block diagram of a multi-phase generator 200 according to at least one embodiment. The multi-phase generator 200 can be similar to the multi-phase generator 104 in FIG. 1, and the 1.5 clock divider 202 is similar to the clock divider 102 of FIG. 1, except the 1.5 clock divider 202 specifically divides a first clock signal 201 with a first frequency by a division factor of 1.5 to generate a second clock signal 203, referred to as a divided clock signal, having a second frequency lower than the first frequency. The division factor is also referred to as a dividing ratio. The multi-phase generator 200 is coupled to the 1.5 clock divider 202 and receives the second clock signal 203 and a positive phase 201(1) and a negative phase 201(2) of the first clock signal 201 used to generate the second clock signal 203. In at least one embodiment, the positive phase 201(1) is the first clock signal 201, and the negative phase 201(2) is an inverse of the first clock signal 201. Alternatively, the positive phase 201(1) is an inverse of the first clock signal 201, and the negative phase 201(2) is the first clock signal 201.

In the illustrated embodiment, the multi-phase generator 200 includes a first shift register 210 with three flip-flops 212, 214, and 216 coupled in series and a second shifter register 220 with three flip-flops 222, 224, and 226 coupled in series. The multi-phase generator 200 also includes three multiplexers 230, 240, and 250. Alternatively, other types of selection circuits can be used. Each output of the three flip-flops is coupled to either a first input or a second input of one of the three multiplexers 230, 240, 250. In the illustrated embodiment, an output of the first flip-flop 212 of the first shift register 210 is coupled to a second input (input 1) of the first multiplexer 230, and an output of the first flip-flop 222 of the second shift register 220 is coupled to a first input (input 0) of the first multiplexer 230. An output of the second flip-flop 214 of the first shift register 210 is coupled to a first input (input 0) of the second multiplexer 240, and an output of the second flip-flop 224 of the second shift register 220 is coupled to a second input (input 1) of the second multiplexer 240. An output of the third flip-flop 216 of the first shift register 210 is coupled to a second input (input 1) of the third multiplexer 250, and an output of the third flip-flop 226 of the second shift register 220 is coupled to a first input (input 0) of the third multiplexer 250. In this embodiment, outputs of the flip-flops of the first shift register 210 alternate between being coupled to a first input or a second input of the respective multiplexers 230, 240, 250, and outputs of the flip-flops of the second shift register 220 alternate in a complementary fashion. The number of multiplexers is equal to the number of flip-flops in each of the shift registers. The number of multiplexers also corresponds to a number of equispatiated phase signals 205 (three in this embodiment) generated by the multi-phase generator 200. In this embodiment, each of the three multiplexers 230, 240, and 250 is clocked by the negative phase 201(2) of the first clock signal 201 used to generate the second clock signal 203. In another embodiment, the three multiplexers 230, 240, and 250 can all be clocked by the positive phase 201(1) of the first clock signal 201. In another embodiment, outputs of the first flip-flop 212 of the first shift register 210 and the first flip-flop 222 of the second shift register 220 can be reversed in how they are coupled to the first multiplexer 230. The subsequent flip-flops would then also be reversed in an alternating fashion from the first flip-flops to maintain the alternating pattern. In another embodiment, the outputs of the flip-flops in the first shift register 210 are coupled to the same first input of all of the multiplexers 230, 240, and 250, and the multiplexers 230, 240, and 250 are clocked in an alternating fashion with the positive phase 201(1) and the negative phase 201(2) of the first clock signal 201.

During operation, the second clock signal 203 (e.g., the divided clock) is fed into the two shift registers 210, 220, each including three flip-flops. The number of flip-flops in each shift register is double the division factor. Here, since the division factor is 1.5, the number of flip-flops is 3. If the division factor were 2.5, the number of flip-flops per shift register would be 5. The sampled signals are then fed as inputs into the three multiplexers 230, 240, 250. As noted above, the number of multiplexers equals the number of phases to be generated. The sampled signals of both shift registers 210, 220 are sequentially entering input 0 and input 1 of the multiplexers 230, 240, 250, and the first clock signal 201, the high-speed clock, operates as the selection signals of the multiplexers 230, 24, 250. At the outputs of the multiplexers 230, 240, 250, the equispatiated phase signals 205 of the second clock signal 203 (the divided clock) are generated.

Figure 7:
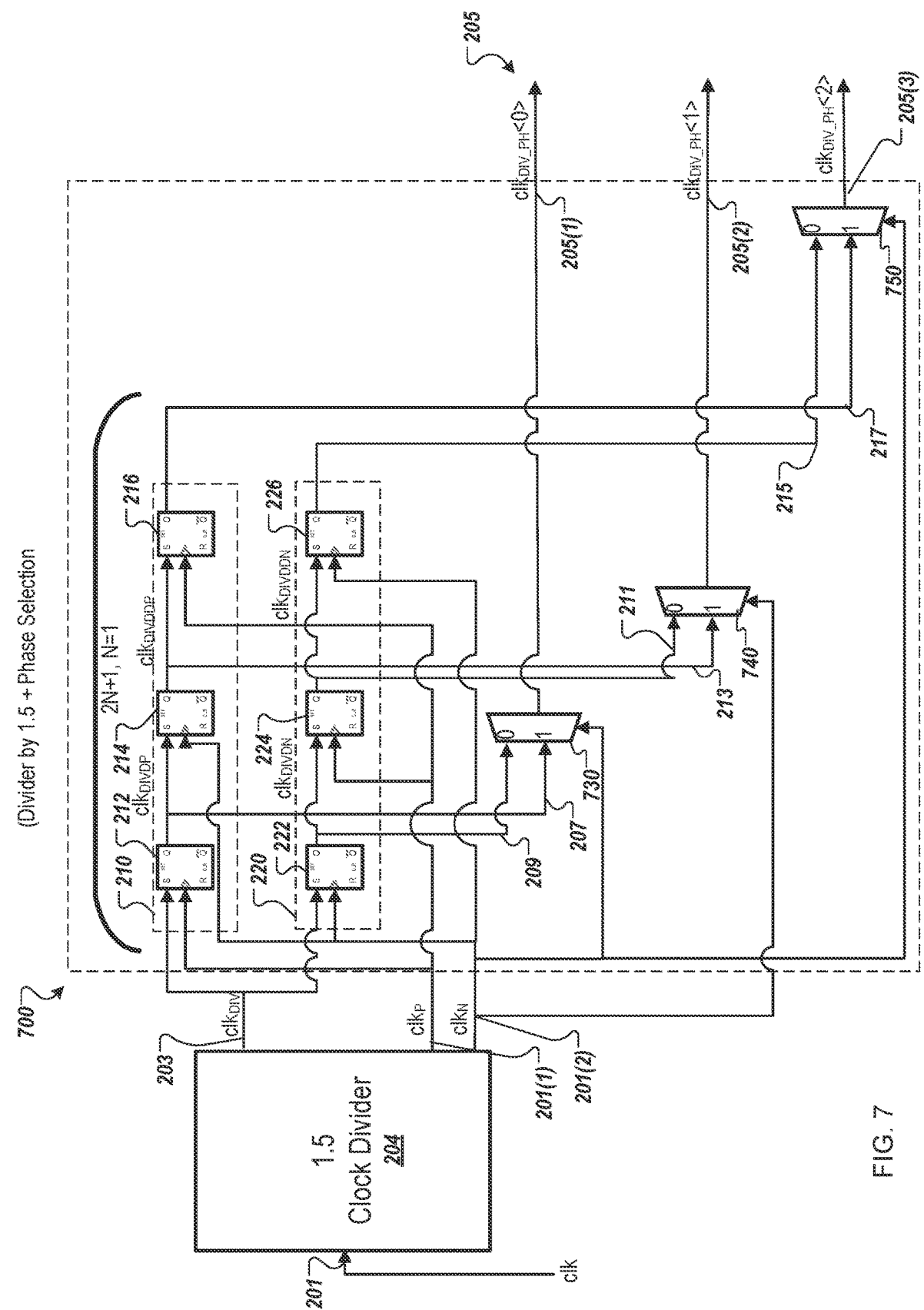
FIG. 7 is a block diagram of a multi-phase generator according to at least one embodiment.

In at least one embodiment, the first flip-flop 212 and the first flip-flop 222 receive the second clock signal 203. The first flip-flop 212 is clocked by the first clock signal 201 (e.g., 201(1)) to generate a first sampled signal 207. The first flip-flop 222 is clocked by an inverse of the first clock signal 201 (e.g., 201(2)) to generate a second sampled signal 209. The first multiplexer 230 includes a first input coupled to an output of the first flip-flop 212 and a second input coupled to an output of the first flip-flop 222. The first multiplexer 230 is clocked by the inverse of the second clock signal 201 (e.g., 201(2) to generate a first phase signal 205(1) of the equispatiated phase signals 205. The second flip-flop 214 receives the first sampled signal 207, and the second flip-flop 224 receives the second sampled signal 209. The second flip-flop 214 is clocked by the inverse of the first clock signal 201 (e.g., 201(2)) to generate a third sampled signal 211. The second flip-flop 224 is clocked by the first clock signal 201 (e.g., 201(1)) to generate a fourth sampled signal 213. The second multiplexer 240 includes a first input coupled to an output of the second flip-flop 224 and a second input coupled to an output of the second flip-flop 214. The second multiplexer 240 is clocked by the inverse of the first clock signal 201 (e.g., 201(2) to generate a second phase signal 205(2) of the equispatiated phase signals 205. The third flip-flop 216 receives the third sampled signal 211, and the third flip-flop 226 receives the fourth sampled signal 213. The third flip-flop 216 is clocked by the first clock signal 201 (e.g., 201(1)) to generate a fifth sampled signal 215. The third flip-flop 226 is clocked by an inverse of the first clock signal 201 (e.g., 201(2)) to generate a sixth sampled signal 217. The third multiplexer 250 includes a first input coupled to an output of the third flip-flop 216 and a second input coupled to an output of the third flip-flop 226. The third multiplexer 250 is clocked by the inverse of the first clock signal 201 (e.g., 201(2) to generate a third phase signal 205(3) of the equispatiated phase signals 205. In this embodiment, the multiplexers 230, 240, 250 use the inverse of the first clock signal 201 (e.g., 201(2)) as a selection signal, and the inputs of the multiplexers 230, 240, 250 alternate between stages of the shift registers. In other embodiments, the first inputs of the multiplexers 230, 240, and 250 are all coupled to the outputs of the flip-flops in the first shift register 210, and the second inputs of the multiplexers 230, 240, 250 are all coupled to the outputs of the flip-flops in the second shift register 220 and clocked with alternating selection signals, such as illustrated in FIG. 7. For example, the first multiplexer 230 uses the first clock signal 201 as its selection signal, and the second multiplexer is 240 uses the inverse of the first clock signal 201 as its selection signal or vice versa.

In at least one embodiment, the first phase signal 205(1) of the equispatiated phase signals 205 has a first phase (e.g., zero degrees), the second phase signal 205(2) of the equispatiated phase signals 205 has a second phase (e.g., 120 degrees) that is offset 120 degrees from the first phase, and the third phase signal 205(3) of the equispatiated phase signals 205 has a third phase (e.g., 240 degrees) that is offset 120 degrees from the second phase and 120 degrees from the first phase. That is, the phases of the first, second, and third phase signals 205(1)-(3) are evenly distributed in phase.

In another embodiment, a first number of flip-flops in the first shifter register 210 equals 2N+1, where N is a positive integer greater than zero and corresponds to a division ratio of a clock divider coupled to the multi-phase generator 200. The division ratio of the clock divider is equal to (2N+1)/2. As illustrated in FIG. 2, the division ratio is equal to 1.5, N equals 1, and a number of the phase signals is equal to three with a 33% duty cycle. In another embodiment, the division ratio is equal to 2.5, N is equal to 2, and a number of phase signals is equal to five.

In at least one embodiment, the components of the multi-phase generator 200 are all-digital circuits. That is, the first shift register 210 and the second shift register 220, and the multiplexers 230, 240, 250 are all-digital circuits. The clock divider 202 and the multi-phase generator 200 are all-digital circuits in another embodiment.

Figure 3:
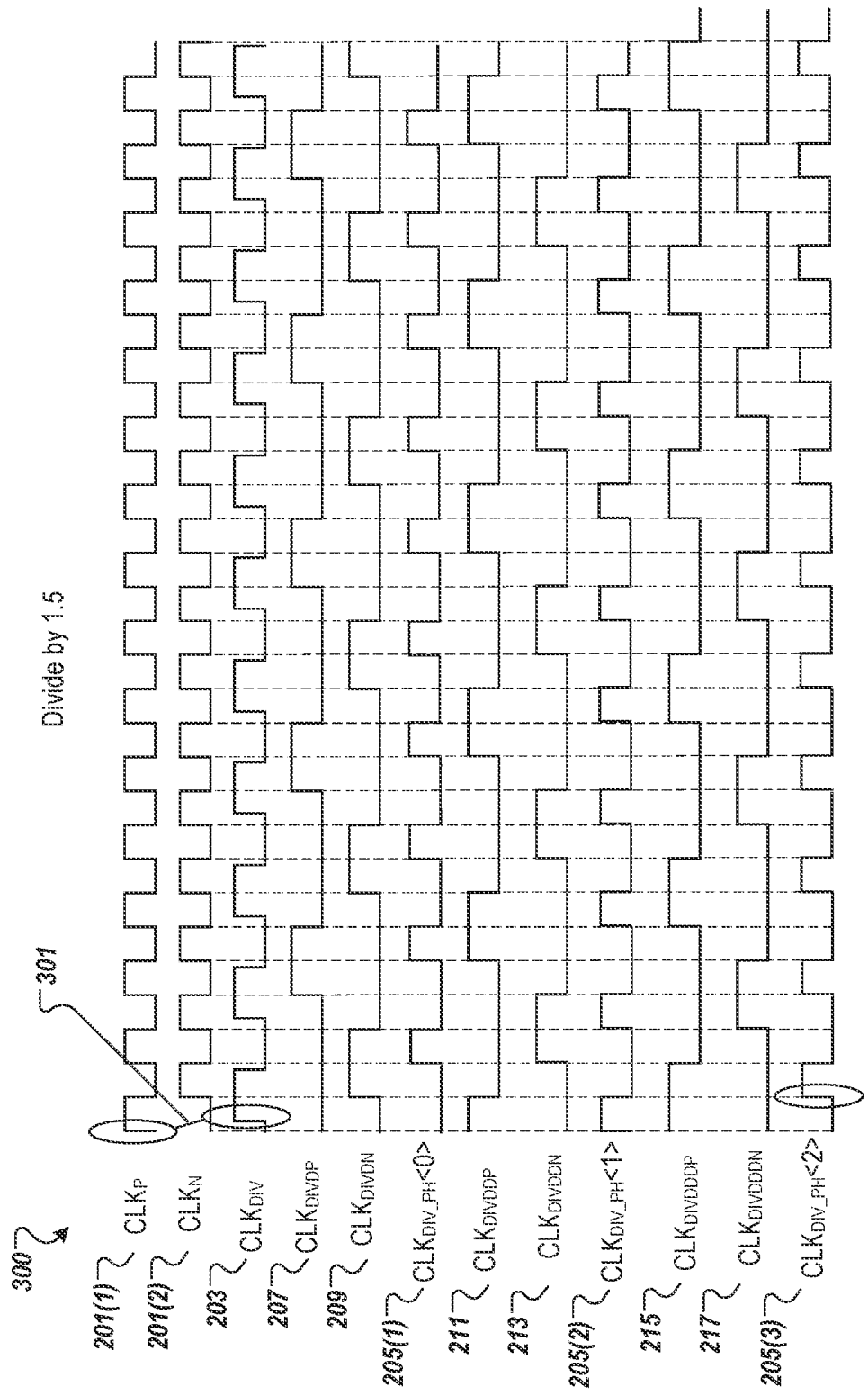
FIG. 3 is a timing diagram of signals of the 1.5 clock divider and multi-phase generator of FIG. 2 with three equispatiated phases having a first output duty cycle according to at least one embodiment.

FIG. 3 is a timing diagram 300 of signals of the 1.5 clock divider and multi-phase generator 200 of FIG. 2 with three equispatiated phases having a first output duty cycle according to at least one embodiment. As illustrated in timing diagram 300, the multi-phase generator 200 receives the positive phase 201(1) and negative phases 201(2) of the first clock signal 201 (e.g., the high-frequency clock signal) and the second clock signal 203 (e.g., the divided clock signal), and generates the first, second, third, fourth, fifth, and sixth sampled signals 207, 209, 211, 213, 215, and 217, respectively, using the first shift register 210 and second shift register 220. The multi-phase generator 200 generates the first, second, and third phase signals 205(1)-(3) using the three multiplexers 230, 240, 250. As illustrated in FIG. 3, the first edges of the three phase signals 205(1)-(3) are evenly distributed in phase, e.g., 120 degrees offset from one another.

The multi-phase generator 200 is inherently robust against phase relationship changes between the high-frequency clock and the divided clock. For example, as illustrated in FIG. 3, there is a first phase relationship 301 between the first clock signal 201 and the second clock signal 203, and the three phase signals 205(1)-(3) are evenly distributed with a 33% duty cycle.

Figure 4:
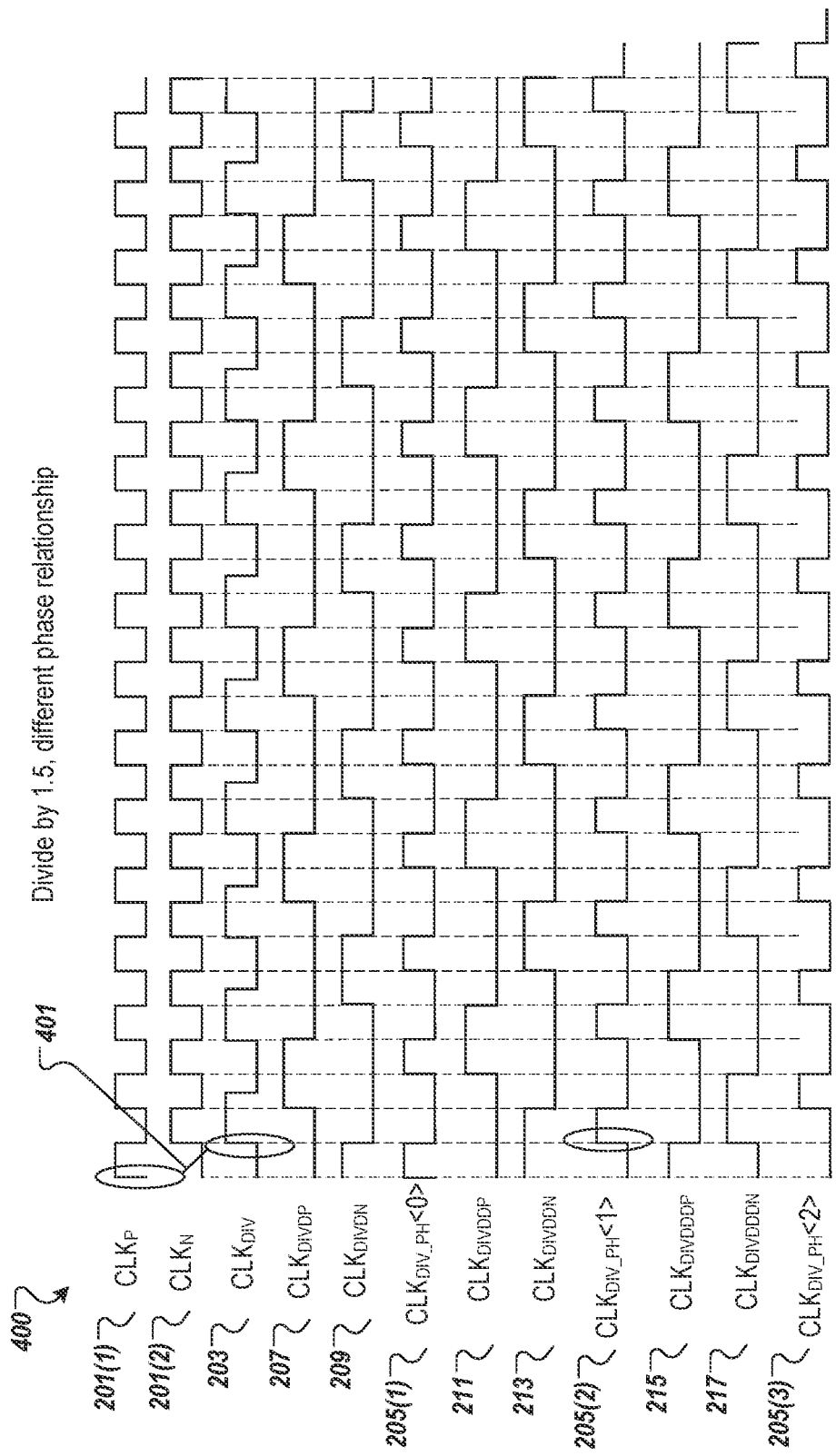
FIG. 4 is a timing diagram of signals of the 1.5 clock divider and multi-phase generator of FIG. 2 with three equispatiated phases having a different phase relationship between a high-frequency clock signal and a divided clock signal according to at least one embodiment.

FIG. 4 is a timing diagram 400 of signals of the 1.5 clock divider and multi-phase generator of FIG. 2 with three equispatiated phases having a different phase relationship between a high-frequency clock signal and a divided clock signal according to at least one embodiment. As illustrated in FIG. 4, there is a second phase relationship 401 between the first clock signal 201 and the second clock signal 203, and the three phase signals 205(1)-(3) are still evenly distributed with a 33% duty cycle. As such, the multi-phase generator 200 is inherently robust against phase relationship changes between the high-frequency clock and the divided clock.

As described herein, the duty cycle of the divided clock can be 50%. Changing the duty cycle of the divided clock to something other than 50% can change a duty cycle of the multiple output phase signals but does not change phase spacing between the multiple output phase signals, as illustrated in FIG. 5.

Figure 5:
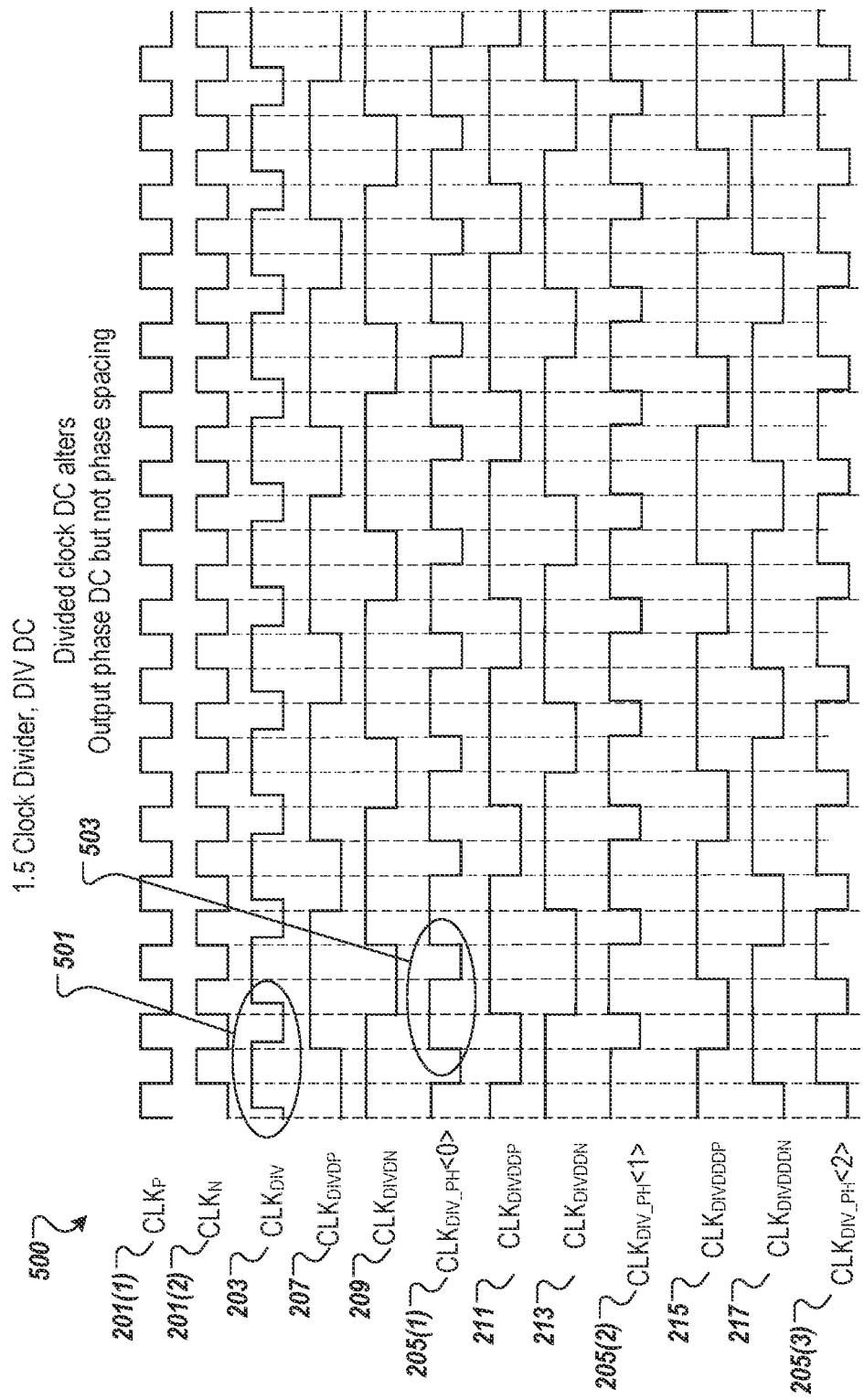
FIG. 5 is a timing diagram of signals of the 1.5 clock divider and multi-phase generator of FIG. 2 with three equispatiated phases having a different duty cycle in the divided clock signal according to at least one embodiment.

FIG. 5 is a timing diagram 500 of signals of the 1.5 clock divider and multi-phase generator 200 of FIG. 2 with three equispatiated phases having a different duty cycle in the divided clock signal according to at least one embodiment. As illustrated in FIG. 5, the second clock signal 203 (e.g., the divided clock) has a duty cycle 501 that is greater than 50% (e.g., 60%). The three phase signals 205(1)-(3) are still evenly distributed but have a larger duty cycle 501 that is greater than 33%. As such, the multi-phase generator 200 is inherently robust against duty cycle changes in the divided clock signal.

As described herein, the duty cycle of the high-frequency clock can be 50%. Changing the duty cycle of the high-frequency clock to something other than 50% can change a duty cycle of the multiple output phase signals and a phase spacing between the multiple output phase signals, as illustrated in FIG. 5.

Figure 6:
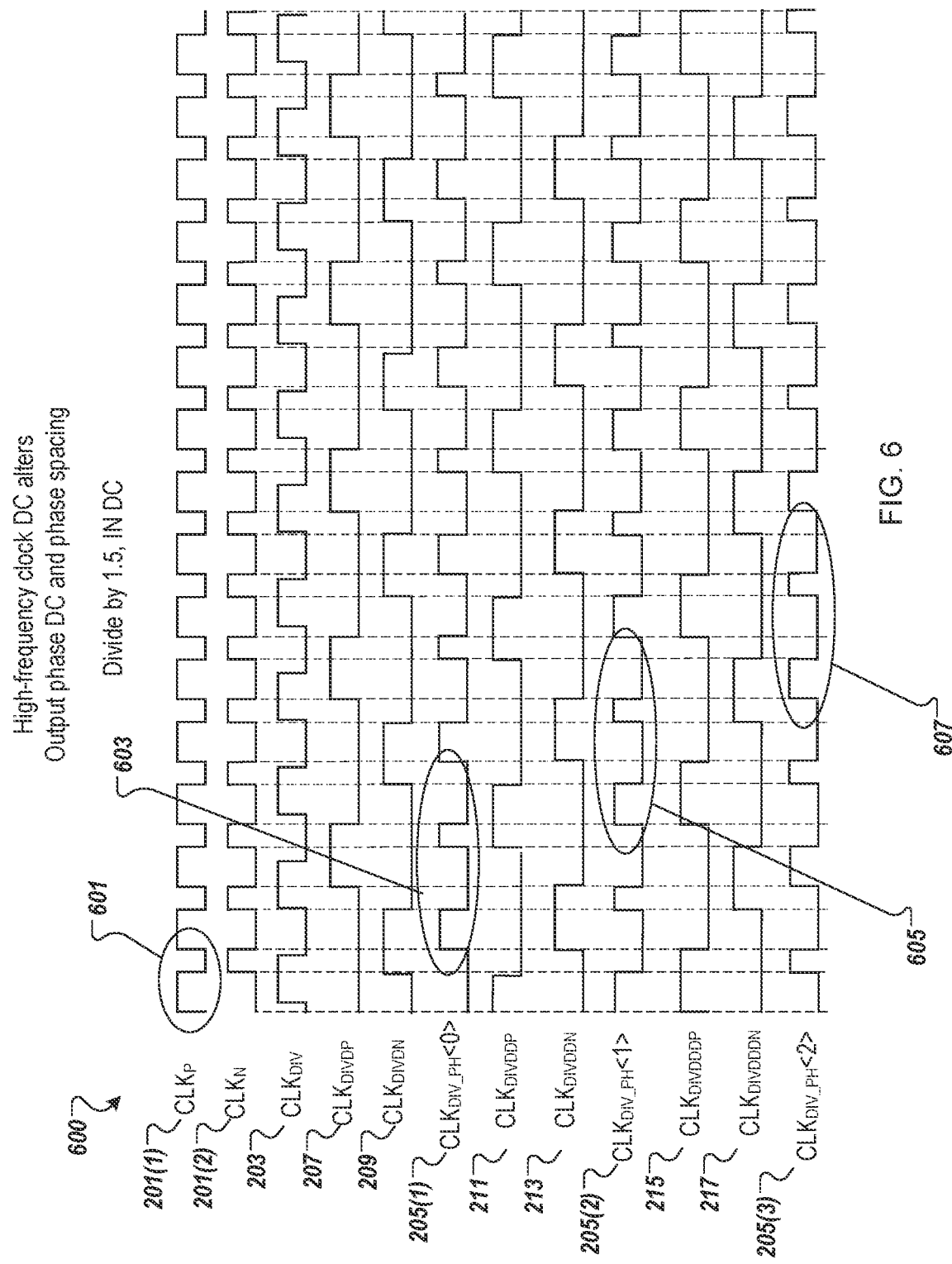
FIG. 6 is a timing diagram of signals of the 1.5 clock divider and multi-phase generator of FIG. 2 with three equispatiated phases for the case that the high-frequency clock signal has a different duty cycle than 50% according to at least one embodiment.

FIG. 6 is a timing diagram 600 of signals of the 1.5 clock divider and multi-phase generator of FIG. 2 with three equispatiated phases for the case that the high frequency clock signal has a different duty cycle than 50% (unlike the case described with reference to FIG. 5 where the divided clock signal has a different duty cycle) according to at least one embodiment. As illustrated in FIG. 6, the first clock signal 201 (e.g., the high-frequency clock) has a duty cycle 601 that is greater than 50% (e.g., 60%). The three phase signals 205(1)-(3) have pulses that do not all have the same duty cycles 603, 605, 607. The three phase signals 205(1)-(3) are phase-shifted versions of one another in which the pulses have different on/off ratios, as illustrated with the ovals labeled 603, 605, 607. In particular, the duty cycle 603 of the first phase signal 205(1) has a first portion greater than 50% and then a second portion less than 50%. The duty cycle 605 of the second phase signal 205(2) has a first portion less than 50% and then a second portion greater than 50%. The duty cycle 607 of the third phase signal 205(3) has a first portion greater than 50% and then a second portion less than 50%. The three phase signals 205(1)-(3) are the same signal, but phase shifted. As such, the embodiment of FIG. 6 in which the high-frequency clock used by the multi-phase generator 200 does not have a 50% duty cycle is not suitable in all applications.

FIG. 7 is a block diagram of a multi-phase generator 700 according to at least one embodiment. The multi-phase generator 700 is similar to the multi-phase generator 200 of FIG. 2, as noted in similar reference numbers except the three multiplexers 730, 740, 750. In particular, all outputs of the flip-flops 212, 214, 216 of the first shift register 210 are coupled to the same inputs (e.g., input 1) of the three multiplexers 730, 740, 750, and all outputs of the flip-flops 222, 214, 216 of the second shift register 220 are coupled to same inputs (e.g., input 0) of the three multiplexers 730, 740, 750, or vice versa. As illustrated, an output of the first flip-flop 212 of the first shift register 210 is coupled to a second input (input 1) of the first multiplexer 230, and an output of the first flip-flop 222 of the second shift register 220 is coupled to a first input (input 0) of the first multiplexer 230. An output of the second flip-flop 214 of the first shift register 210 is coupled to a second input (input 1) of the second multiplexer 240, and an output of the second flip-flop 224 of the second shift register 220 is coupled to a first input (input 0) of the second multiplexer 240. An output of the third flip-flop 216 of the first shift register 210 is coupled to a second input (input 1) of the third multiplexer 250, and an output of the third flip-flop 226 of the second shift register 220 is coupled to a first input (input 0) of the third multiplexer 250. In this embodiment, outputs of the flip-flops of the first shift register 210 do not alternate between being coupled to a first input or a second input of the respective multiplexers as done in the multiplexers 230, 240, 250 of FIG. 2. Similarly, the outputs of the flip-flops of the second shift register 220 do not alternate in a complementary fashion as done in the multiplexers 230, 240, 250 of FIG. 2. In this embodiment, the three multiplexers 730, 740, and 750 are clocked alternatingly. In one embodiment, the first multiplexer 730 is clocked by the negative phase 201(2) of the first clock signal 201, the second multiplexer 740 is clocked by the positive phase 201(1) of the first clock signal 201, and the third multiplexer 750 is clocked by the negative phase 201(2) of the first clock signal 201. In another embodiment, the first multiplexer 730 is clocked by the positive phase 201(1) of the first clock signal 201, the second multiplexer 740 is clocked by the negative phase 201(2) of the first clock signal 201, and the third multiplexer 750 is clocked by the positive phase 201(1) of the first clock signal 201.

Various embodiments described above are directed to a 1.5 clock divider and a multi-phase generator that generates three equispatiated phase signals using the divided clock signal and the high-frequency clock signal from which the divided clock is derived. In other embodiments, other clock dividers with different division factors can be used, such as a 2.5 clock divider illustrated in FIG. 8.

Figure 8:
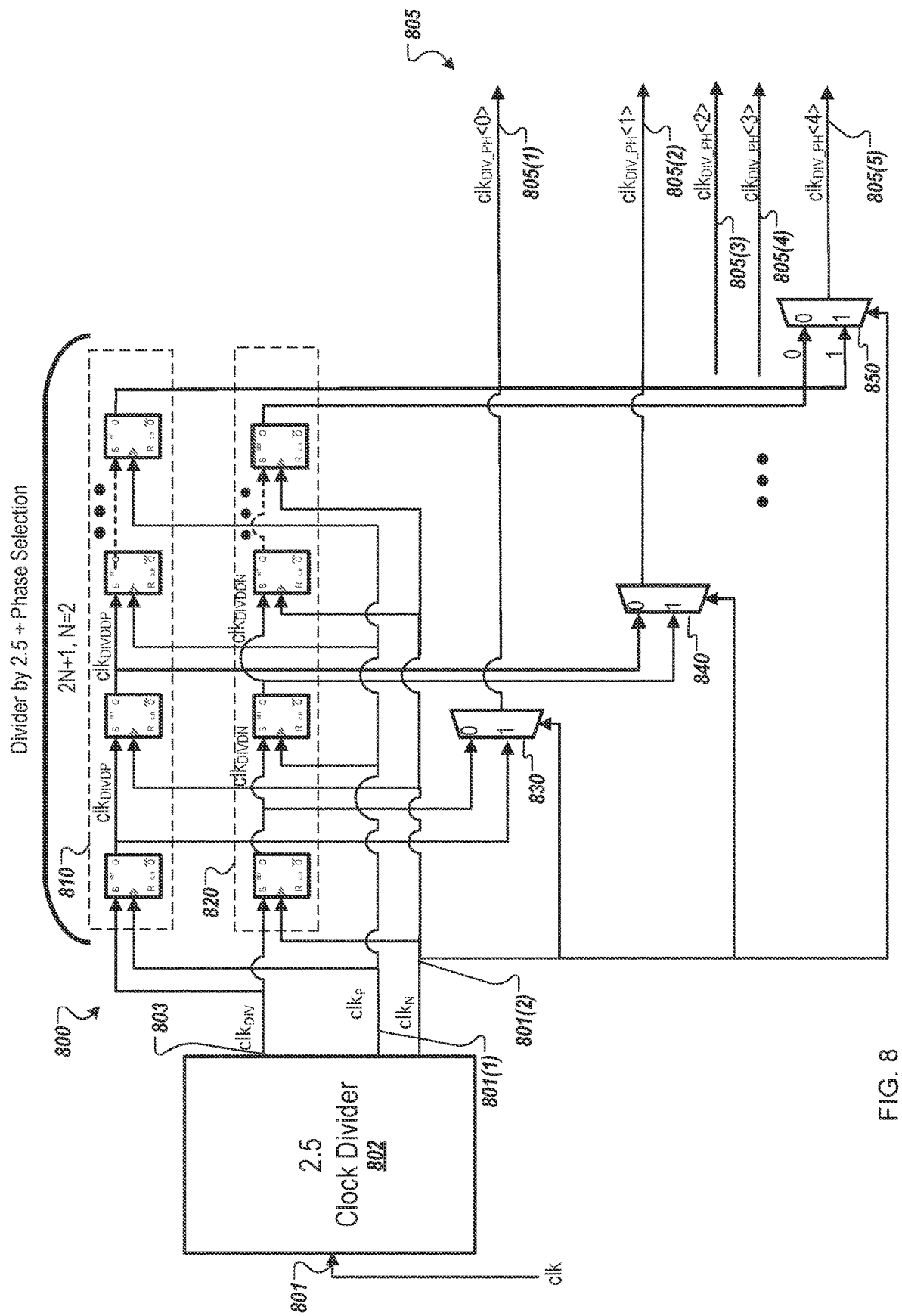
FIG. 8 is a block diagram of a multi-phase generator coupled to a 2.5 clock divider according to at least one embodiment.

FIG. 8 is a block diagram of a multi-phase generator 800 coupled to a 2.5 clock divider 802 according to at least one embodiment. The multi-phase generator 800 can be similar to the multi-phase generator 104 in FIG. 1, and the 2.5 clock divider 802 is similar to the clock divider 102 of FIG. 1, except the 2.5 clock divider 802 specifically divides a first clock signal 801 with a first frequency by a division factor of 2.5 to generate a second clock signal 803, referred to as a divided clock signal, having a second frequency lower than the first frequency. The multi-phase generator 800 is coupled to the 2.5 clock divider 802 and receives the second clock signal 803 and a positive phase 801(1) and a negative phase 801(2) of the first clock signal 801 used to generate the second clock signal 803. In at least one embodiment, the positive phase 801(1) is the first clock signal 801, and the negative phase 801(2) is an inverse of the first clock signal 801. Alternatively, the positive phase 801(1) is an inverse of the first clock signal 801, and the negative phase 801(2) is the first clock signal 801.

In the illustrated embodiment, the multi-phase generator 800 includes a first shift register 810 with five flip-flops coupled in series and a second shifter register 820 with five flip-flops coupled in series. The multi-phase generator 800 also includes five multiplexers 830-850. Alternatively, other types of selection circuits can be used. Each output of the five flip-flops is coupled to either a first input or a second input of one of the five multiplexers 830-850. In the illustrated embodiment, an output of a first flip-flop of the first shift register 810 is coupled to a second input (input 1) of a first multiplexer 830, and an output of a first flip-flop of the second shift register 820 is coupled to a first input (input 0) of the first multiplexer 830. An output of a second flip-flop of the first shift register 810 is coupled to a first input (input 0) of a second multiplexer 840, and an output of a second flip-flop of the second shift register 820 is coupled to a second input (input 1) of the second multiplexer 840. An output of a third flip-flop of the first shift register 810 is coupled to a second input (input 1) of a third multiplexer (not illustrated in FIG. 8), and an output of a third flip-flop of the second shift register 820 is coupled to a first input (input 0) of the third multiplexer. An output of a fourth flip-flop of the first shift register 810 is coupled to a first input (input 0) of a fourth multiplexer (not illustrated in FIG. 8), and an output of a fourth flip-flop of the second shift register 820 is coupled to a second input (input 1) of the fourth multiplexer. An output of a fifth flip-flop of the first shift register 810 is coupled to a second input (input 1) of a fifth multiplexer 850, and an output of a fifth flip-flop of the second shift register 820 is coupled to a first input (input 0) of the fifth multiplexer 850.

In this embodiment, outputs of the flip-flops of the first shift register 810 alternate between being coupled to a first input or a second input of the respective multiplexers 830-850, and outputs of the flip-flops of the second shift register 820 alternate in a complementary fashion. The number of multiplexers is equal to the number of flip-flops in each of the shift registers. The number of multiplexers also corresponds to a number of equispatiated phase signals 805 (five in this embodiment) generated by the multi-phase generator 800. In this embodiment, each of the five multiplexers 830-850 are all clocked by the negative phase 801(2) of the first clock signal 801 used to generate the second clock signal 803. In another embodiment, the five multiplexers 830-850 can all be clocked by the positive phase 801(1) of the first clock signal 801. In another embodiment, outputs of the first flip-flop 812 of the first shift register 810 and the first flip-flop 828 of the second shift register 820 can be reversed in how they are coupled to the first multiplexer 830. The subsequent flip-flops would then also be reversed in an alternating fashion from the first flip-flops to maintain the alternating pattern. In another embodiment, the outputs of the flip-flops in the first shift register 810 are coupled to the same first input of all of the five multiplexers 830-850, and the five multiplexers 830-850 are clocked in an alternating fashion with the positive phase 801(1) and the negative phase 801(2) of the first clock signal 801.

During operation, the second clock signal 803 (e.g., the divided clock) is fed into the two shift registers 810, 812, each including five flip-flops. The number of flip-flops in each shift register is double the division factor. Here, since the division factor is 2.5, the number of flip-flops is 5. The sampled signals are then fed as inputs into the five multiplexers 830-850. As noted above, the number of multiplexers is equal to a number of phases generated. The sampled signals of both shift registers 810, 820 are sequentially entering input 0 and input 1 of the multiplexers 830-850, and the higher-speed, first clock signal 801 (e.g., negative phase 801(2)), operates as the selection signals of the multiplexers 830-850. At the outputs of the multiplexers 830-850, the equispatiated phase signals 805 of the second clock signal 803 (the divided clock) are generated.

In at least one embodiment, the flip-flops generate sampled signals, and the multiplexers 830-850 similarly generate the phase signals as described above with respect to FIG. 2. The first multiplexer 830 is clocked by the inverse of the second clock signal 801 (e.g., 801(2) to generate a first phase signal 805(1) of the equispatiated phase signals 805. The second multiplexer 840 is clocked by the inverse of the second clock signal 801 (e.g., 801(2) to generate a second phase signal 805(2) of the equispatiated phase signals 805. The third multiplexer is clocked by the inverse of the second clock signal 801 (e.g., 801(2) to generate a third phase signal 805(3) of the equispatiated phase signals 805. The fourth multiplexer is clocked by the second clock signal 801 (e.g., 801(2) to generate a fourth phase signal 805(4) of the equispatiated phase signals 805. The fifth multiplexer 850 is clocked by the inverse of the second clock signal 801 (e.g., 801(2) to generate a fifth phase signal 805(5) of the equispatiated phase signals 805.

In this embodiment, the multiplexers 830-850 use the inverse of the second clock signal 801 (e.g., 801(2)) as a selection signal, and the multiplexers 830-850 alternate inputs between stages of the shift registers. In other embodiments, the first inputs of the multiplexers 830-850 are all coupled to the outputs of the flip-flops in the first shift register 810, and the second inputs of the multiplexers 830-850 are all coupled to the outputs of the flip-flops in the second shift register 820 and clocked with alternating selection signals, such as illustrated in FIG. 7. For example, the first multiplexer 830 uses the second clock signal 801 as its selection signal, and the second multiplexer is 840 uses the inverse of the second clock signal 801 as its selection signal or vice versa.

In at least one embodiment, the first phase signal 805(1) of the equispatiated phase signals 805 has a first phase (e.g., zero degrees), the second phase signal 805(2) of the equispatiated phase signals 805 has a second phase (e.g., 72 degrees) that is offset 72 degrees from the first phase, the third phase signal of the equispatiated phase signals 805 has a third phase (e.g., 144 degrees) that is offset 72 degrees from the second phase, the fourth phase signal of the equispatiated phase signals 805 has a fourth phase (e.g., 216 degrees) that is offset 72 degrees from the third phase, and the fifth phase signal 805(5) of the equispatiated phase signals 805 has a fifth phase (e.g., 288 degrees) that is offset 72 degrees from the fourth phase and 72 degrees from the first phase. That is, the phases of the five phase signals 805(1)-(5) are evenly distributed in phase.

In another embodiment, a first number of flip-flops in the first shifter register 810 is equal to 2N+1, where N is a positive integer greater than zero and corresponds to a division ratio of a clock divider coupled to the multi-phase generator 800. The division ratio of the clock divider is equal to (2N+1)/2. As illustrated in FIG. 8, the division ratio is equal to 2.5, N is equal to 2, and a number of the phase signals is equal to five.

In at least one embodiment, the components of the multi-phase generator 800 are all-digital circuits. That is, the first shift register 810 and the second shift register 820, and the multiplexers 830-850 are all-digital circuits. In another embodiment, the clock divider 802 and the multi-phase generator 800 are all-digital circuits.

Figure 9:
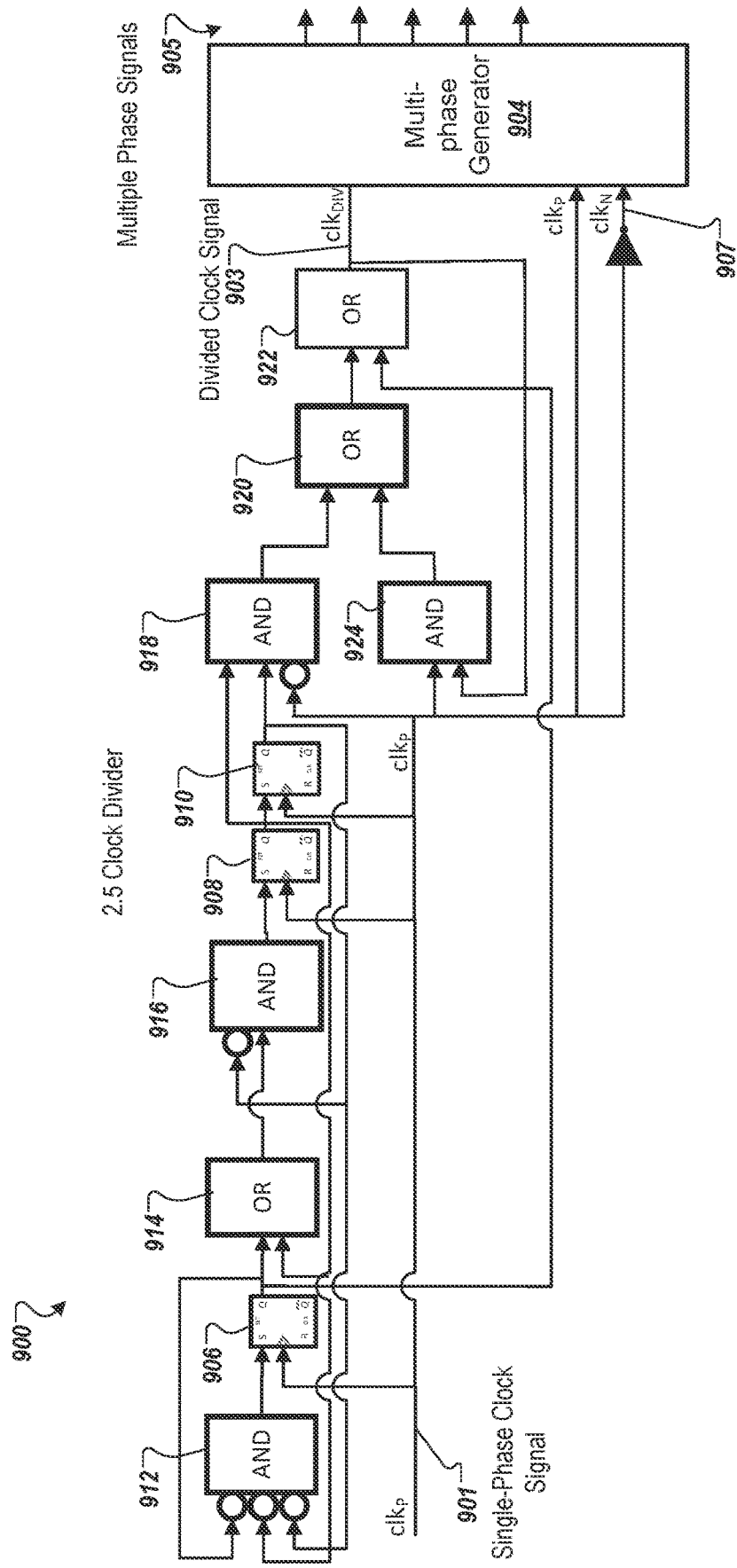
FIG. 9 is a block diagram of a 2.5 clock divider according to at least one embodiment.

FIG. 9 is a block diagram of a 2.5 clock divider 900 according to at least one embodiment. The 2.5 clock divider 900 is coupled to a multi-phase generator 904. The multi-phase generator 904 is similar to the multi-phase generator 104 of FIG. 1 or the multi-phase generator 800 of FIG. 8. The 2.5 clock divider 900 includes a first flip-flop 906, a second flip-flop 908, and a third flip-flop 910, each clocked by a single-phase clock signal 901, and multiple logic gates. A first AND gate 912 receives an output from each of the three flip-flops 906-910. The output of the first AND gate 912 is coupled to an input of the first flip-flop 906. The output of the first flip-flop 906 is coupled to a first OR gate 914. The first OR gate 914 receives the output of the first flip-flop 906 and the output of the second flip-flop 908. An output of the first OR gate 914 is coupled to an input of a second AND gate 916. The second AND gate 916 also receives the output of the third flip-flop 910 at an inverse input. An output of the second AND gate 916 is coupled to an input of the second flip-flop 908. An output of the second flip-flop 908 is coupled to an input of the third flip-flop 910. An output of the third flip-flop 910 is coupled to an input of a third AND gate 918. The third AND gate 918 also receives the output of the second flip-flop 908 and the single-phase clock signal 901 at an inverse input. An output of the third AND gate 918 is coupled to a second OR gate 920. An output of the second OR gate 920 is coupled to a third OR gate 922. The second OR gate 920 also receive an output of a fourth AND gate 924, which receives the single-phase clock signal 901 and an output of the third OR gate 922. The third OR gate 922 also receives the output of the first flip-flop 906. The output of the third OR gate 922 is the divided clock signal 903. The multi-phase generator 904 receives the divided clock signal 903, the single-phase clock signal 901, and an inverse of the single-phase clock signal 907. The multi-phase generator 904 generates five phase signals 905 using the divided clock signal 903, the single-phase clock signal 901, and the inverse of the single-phase clock signal 907.

This embodiment uses three flip-flops, four AND gates, and three OR gates for the 2.5 clock divider 900. In other embodiments, the 2.5 clock divider 900 can include other configurations of gates and flip-flops to divide the single-phase clock signal 901 by a division factor of 2.5 to generate the divided clock signal 903.

Figure 10:
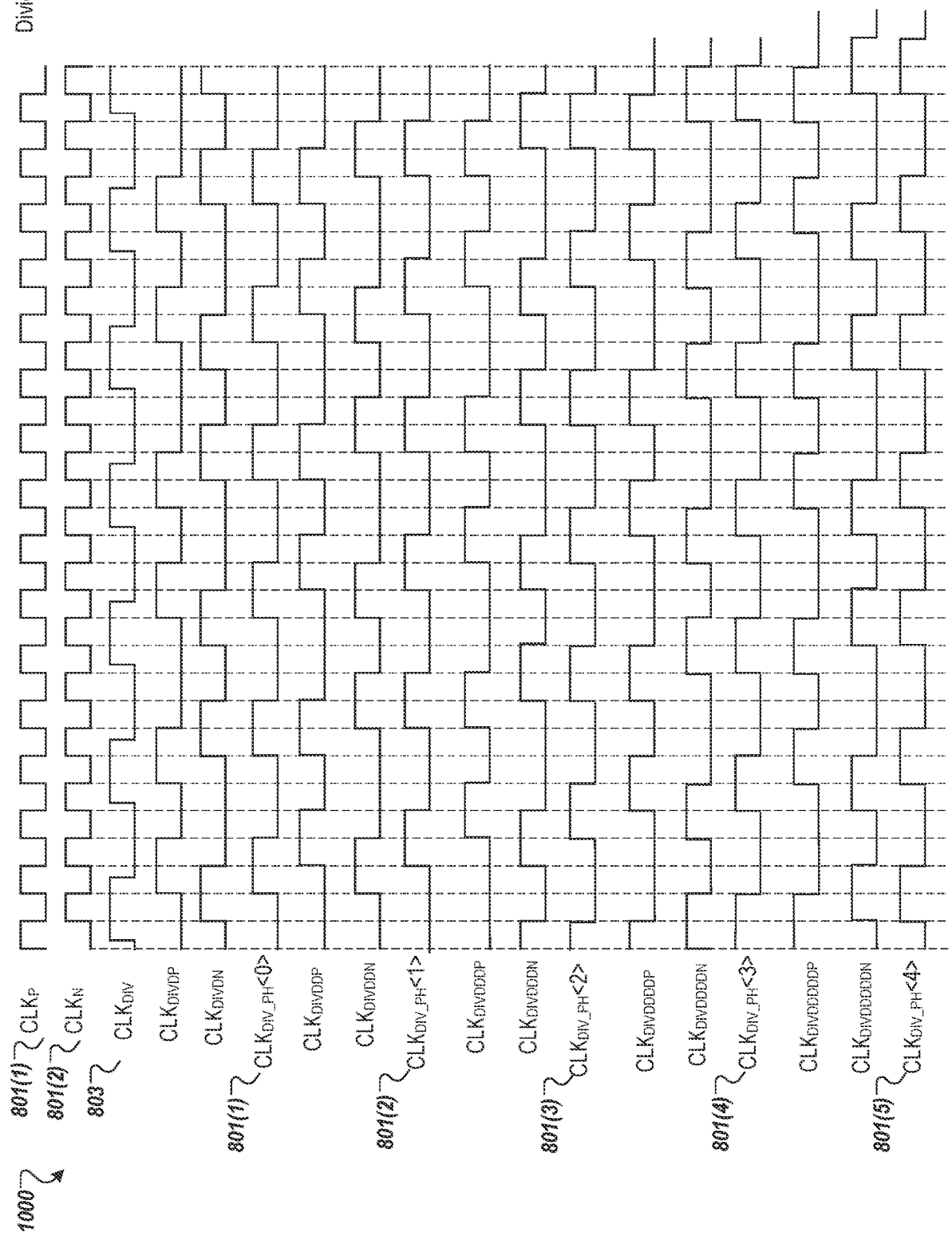
FIG. 10 is a timing diagram of signals of the 1.5 clock divider and multi-phase generator of FIG. 8 with five equispatiated phases according to at least one embodiment.

FIG. 10 is a timing diagram 1000 of signals of the 1.5 clock divider and multi-phase generator of FIG. 8 with five equispatiated phases according to at least one embodiment. As illustrated in timing diagram 1000, the multi-phase generator 800 receives the positive phase 801(1) and negative phases 801(2) of the first clock signal 801 (e.g., the high-frequency clock signal) and the second clock signal 803 (e.g., the divided clock signal), and generates various sample signals using the first shift register 810 and second shift register 820. The multi-phase generator 800 generates the first, second, third, fourth, and fifth phase signals 805(1)-(5) using the five multiplexers 830-850. As illustrated in FIG. 10, first edges of the five phase signals 205(1)-(5) are evenly distributed in phase, e.g., 72 degrees offset from one another. That is, the first edges of the five phase signals 805(1)-(5) are evenly distributed from one another.

Figure 11:
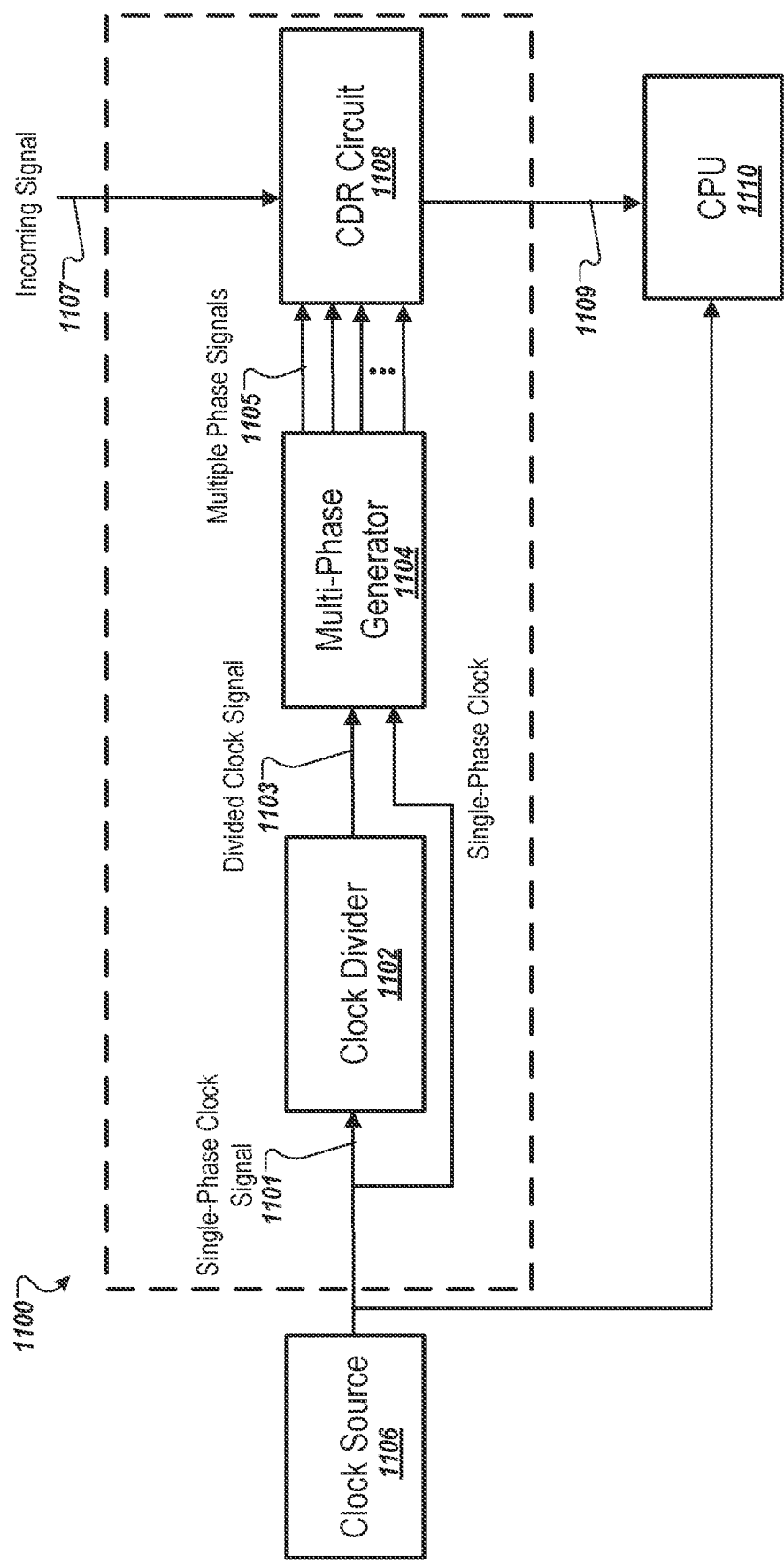
FIG. 11 is a block diagram of an interface circuit with a clock divider and a multi-phase generator according to at least one embodiment.

The integrated circuit having a clock divider and a multi-phase generator can be used in various circuits, such as an interface circuit where the multi-phase signals are used to oversample an incoming signal, as illustrated in FIG. 11. Alternatively, the integrated circuit can be implemented in other types of circuits where multiple phases of a single-phase clock signal are needed.

FIG. 11 is a block diagram of an interface circuit 1100 with a clock divider 1102 and a multi-phase generator 1104 according to at least one embodiment. The interface circuit 1100 includes the clock divider 1102, the multi-phase generator 1104, and a clock-and-data recovery (CDR) circuit 1108. The interface circuit 1100 can be a receiver that receives an incoming signal 1107. The CDR circuit 1108 can oversample the incoming signal 1107 and send samples 1109 to a central processing unit (CPU) 1110. The CPU 1110 can also receive the single-phase clock signal 1101. Since the CDR circuit 1108 needs to oversample the incoming signal, the CDR circuit 1108 needs multiple phases of a divided clock signal 1103. The multi-phase generator 1104 generates the multiple phases of the divided clock signal 1103 using the divided clock signal 1103 and the single-phase clock signal 1101 from which the divided clock signal 1103 is derived. The interface circuit 1100, the clock source 106, and the CPU 1110 can be part of an electronic device. In some embodiments, the clock divider 1102 and the multi-phase generator 1104 are integrated into a multi-phase generation circuit coupled to the receiver. The multi-phase generation circuit can be an all-digital circuit.

As illustrated in FIG. 11, the clock divider 1102 is coupled to a clock source 1106. The clock divider 1102 receives a clock divider to receive a single-phase clock signal 1101 from the clock source 106. The clock divider 1102 generates a divided clock signal 1103. The single-phase clock signal 1101 can be considered a high-frequency clock relative to the divided clock signal 1103 that is a lower frequency clock. The single-phase clock signal 1101 can be divided by a non-integer factor as expressed in equation (1) above. For example, the clock divider 1102 can be a 1.5 clock divider that divides the single-phase clock signal 1101 by 1.5 or a 2.5 clock divider that divides the single-phase clock signal 1101 by 2.5. The multi-phase generator 1104 is coupled to the clock divider 102. The multi-phase generator 1104 receives the divided clock signal 1103 and the single-phase clock signal 1101 from which the divided clock signal 1103 is derived. In another embodiment, the multi-phase generator 1104 receives the divided clock signal 1103, a positive phase of the single-phase clock signal 1101, and a negative phase of the single-phase clock signal 1101. The multi-phase generator 1104 generates a set of phase signals 1105 using the divided clock signal 1103 and the single-phase clock signal 1101. The phases of the set of phase signals 1105 are equispatiated. That is, a first edge of each phase signal is evenly distributed from one another in phase (or in the phase domain). For example, if there are five phase signals in the set of phase signals 1105, each first edge of the five phase signals are spaced evenly, such as at 0 degrees, 72 degrees, 144 degrees, 216 degrees, and 288 degrees. For another example, if there are three phase signals in the set of phase signals 1105, the first edges of the five phase signals are spaced evenly, such as at 0 degrees, 120 degrees, and 240 degrees.

In at least one embodiment, the interface circuit 1100, the clock source 1106, and the CPU 1110 are part of a microcontroller. The microcontroller can receive a first clock signal (e.g., 1101) with 800 MHz. The microcontroller, however, receives data via the interface circuit 1100 at a rate of 320 Mbps. That is, a receiver of the interface circuit 1100 includes the CDR circuit 1108 that receives the multiple phase signals 1105 to oversample the incoming signal 1107. Thus, the clock divider 1102 can generate the divided clock signal 1103 at 320 MHz using a division factor of 2.5. The CDR circuit 1108 then oversamples the incoming signal 1107 using five different phase signals 1105 generated by the multi-phase generator 1104. The five phases are evenly distributed with an offset of 72 degrees from each other. The clock divider 1102 receives the first clock signal (e.g., 1101) and generates a second clock signal (e.g., 1103) with a second frequency lower than the first frequency. The multi-phase generator 1104 generates multiple phase signals (e.g., 1105) using the first and second clock signals.

In at least one embodiment, the multi-phase generator 1104 includes a first shift register with a first number of flip-flops and a second shift register with the first number of flip-flops. The first number of flip-flops is equal to 2N+1, where N is a positive integer greater than zero and corresponds to a division ratio of the clock divider. The division ratio of the clock divider is equal to (2N+1)/2. The multi-phase generator 1104 includes multiple multiplexers. Each output of the first number of flip-flops in both shift registers is coupled to either a first input or a second input of a respective one of the multiplexers. A number of multiplexers is equal to the first number.

In at least one embodiment, the multi-phase generator 1104 includes a first flip-flop to receive the second clock signal (e.g., 1103). The first flip-flop is clocked by the first clock signal (e.g., 1101) to generate a first sampled signal. The multi-phase generator 1104 includes a second flip-flop to receive the second clock signal (e.g., 1103). The second flip-flop is clocked by an inverse of the first clock signal (e.g., 1101) to generate a second sampled signal. The multi-phase generator 1104 includes a first multiplexer with a first input coupled to an output of the first flip-flop and a second input coupled to an output of the second flip-flop. The first multiplexer is clocked by the inverse of the first clock signal to generate a first phase signal.

In a further embodiment, the multi-phase generator 1104 includes a third flip-flop to receive the first sampled signal. The third flip-flop is clocked by the inverse of the first clock signal to generate a third sampled signal. The multi-phase generator 1104 includes a fourth flip-flop to receive the second sampled signal. The fourth flip-flop is clocked by the first clock signal to generate a fourth sampled signal. The multi-phase generator 1104 includes a second multiplexer with a first input coupled to an output of the fourth flip-flop and a second input coupled to an output of the third flip-flop. The second multiplexer is clocked by the inverse of the first clock signal to generate a second phase signal. In further embodiments, the multi-phase generator 1104 includes additional flip-flops similarly to the first and second flip-flops.

In another embodiment, the multi-phase generator 1104 includes a third flip-flop to receive the first sampled signal. The third flip-flop is clocked by the inverse of the first clock signal to generate a third sampled signal. The multi-phase generator 1104 includes a fourth flip-flop to receive the second sampled signal. The fourth flip-flop is clocked by the first clock signal to generate a fourth sampled signal. The multi-phase generator 1104 includes a second multiplexer comprising a first input coupled to an output of the third flip-flop and a second input coupled to an output of the fourth flip-flop. The second multiplexer is clocked by the first clock signal to generate a second phase signal. In further embodiments, the multi-phase generator 1104 includes additional flip-flops similarly to the first and second flip-flops.

In at least one embodiment, the interface circuit 1100 includes all-digital circuits. In another embodiment, the clock divider 1102 and the multi-phase generator 1104 are all-digital circuits. In another embodiment, the multi-phase generator 1104 is an all-digital circuit.

In another embodiment, the interface circuit 1100 is a receiver. The receiver includes the CDR circuit 1108 to sample the incoming signal 1107 using multiple phase signals 1105 (e.g., 3 phase signals, 5 phase signals, 7 phase signals, or the like). The clock divider 1102 can receive the single-phase clock signal 1101 from a clock source and generate the divided clock signal 1103. The multi-phase generator 1104 receives the divided clock signal 1103 and the single-phase clock signal 1101. The multi-phase generator 1104 generates the multiple phase signals 1105 using the divided clock signal 1103 and the single-phase clock signal 1101.

Figure 12:
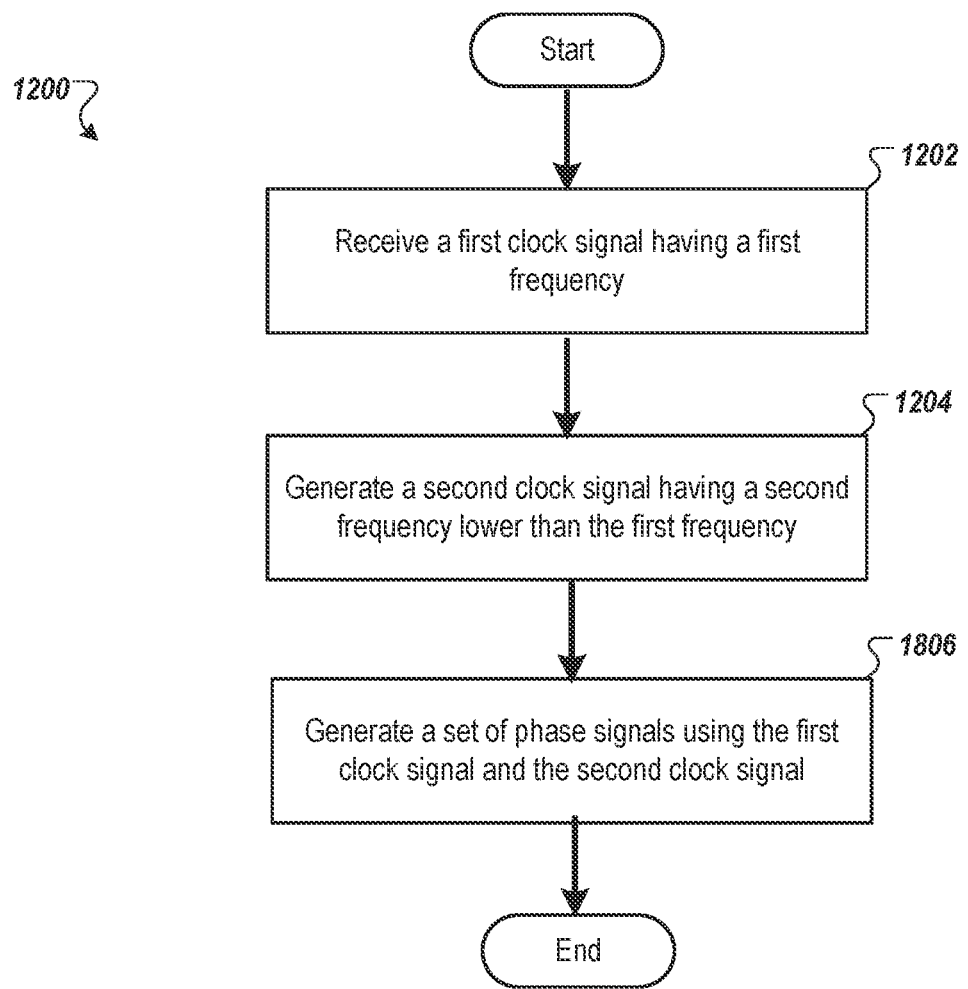
FIG. 12 is a flow diagram of a method of operating an integrated circuit for multi-phase signal generation according to at least one embodiment

FIG. 12 is a flow diagram of a method 1200 of operating an integrated circuit for multi-phase signal generation according to at least one embodiment. In some embodiments, processing logic may perform the method 1200. The processing logic may include hardware, software, or any combination thereof. In one embodiment, the processing logic of the integrated circuit 100 of FIG. 1 performs the method 1200. In another embodiment, the processing logic of the clock divider and multi-phase generator of FIGS. 2, 7, 8, 9, and 10 perform the method 1200. Alternatively, other components may be used to perform some or all of the operations of method 1200.

Referring to FIG. 12, the processing logic begins the method 1200 by receiving a first clock signal (block 1202). The first clock signal has a first frequency. The processing logic generates a second clock signal having a second frequency lower than the first frequency using the first clock signal (block 1204). The processing logic generates a set of phase signals using the first clock signal and the second clock signal (1206), and the method 1200 ends. The set of phase signals are equispatiated (i.e., evenly distributed in phase).

The method 1200 can further include the processing logic oversampling an incoming signal using the set of phase signals. Alternatively, the processing logic can use the set of phase signals for other purposes.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "applying," "coupling," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details, such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An integrated circuit comprising:
   a clock divider to receive a single-phase clock signal from a clock source and to generate a divided clock signal; and
   a phase generator coupled to the clock divider, the phase generator to:
   receive the divided clock signal and the single-phase clock signal; and
   generate a plurality of phase signals using the divided clock signal and the single-phase clock signal, wherein a number of phase signals of the plurality of phase signals is an odd integer and all phases of the plurality of phase signals are equispatiated.

2. The integrated circuit of claim 1, wherein the phase generator comprises:
   a first shift register comprising a first number of flip-flops;
   a second shifter register comprising the first number of flip-flops; and
   a plurality of multiplexers, wherein each output of the first number of flip-flops is coupled to either a first input or a second input of a respective one of the plurality of multiplexers, and wherein a number of multiplexers is equal to the first number.

3. The integrated circuit of claim 2, wherein the first number of flip-flops is equal to 2N+1, where N is a positive integer greater than zero and corresponds to a division ratio of the clock divider, wherein the division ratio of the clock divider is equal to (2N+1)/2.

4. The integrated circuit of claim 3, wherein the division ratio is equal to 1.5 and N is equal to 1, wherein the number of the plurality of phase signals is equal to three.

5. The integrated circuit of claim 3, wherein the division ratio is equal to 2.5 and N is equal to 2, wherein the number of the plurality of phase signals is equal to five.

6. The integrated circuit of claim 1, wherein the phase generator comprises:
   a first flip-flop to receive the divided clock signal, wherein the first flip-flop is clocked by the single-phase clock signal to generate a first sampled signal;
   a second flip-flop to receive the divided clock signal, wherein the second flip-flop is clocked by an inverse of the single-phase clock signal to generate a second sampled signal; and
   a first multiplexer comprising a first input coupled to an output of the first flip-flop and a second input coupled to an output of the second flip-flop, wherein the first multiplexer is clocked by the inverse of the single-phase clock signal to generate a first phase signal of the plurality of phase signals.

7. The integrated circuit of claim 6, wherein the phase generator further comprises:
   a third flip-flop to receive the first sampled signal, wherein the third flip-flop is clocked by the inverse of the single-phase clock signal to generate a third sampled signal;

a fourth flip-flop to receive the second sampled signal, wherein the fourth flip-flop is clocked by the single-phase clock signal to generate a fourth sampled signal; and a second multiplexer comprising a first input coupled to an output of the fourth flip-flop and a second input coupled to an output of the third flip-flop, wherein the second multiplexer is clocked by the inverse of the single-phase clock signal to generate a second phase signal of the plurality of phase signals.

8. The integrated circuit of claim 6, wherein the phase generator further comprises:

a third flip-flop to receive the first sampled signal, wherein the third flip-flop is clocked by the inverse of the single-phase clock signal to generate a third sampled signal;

a fourth flip-flop to receive the second sampled signal, wherein the fourth flip-flop is clocked by the single-phase clock signal to generate a fourth sampled signal; and a second multiplexer comprising a first input coupled to an output of the third flip-flop and a second input coupled to an output of the fourth flip-flop, wherein the second multiplexer is clocked by the single-phase clock signal to generate a second phase signal of the plurality of phase signals.

9. The integrated circuit of claim 1, wherein the clock divider and the phase generator are all-digital circuits.

10. An electronic device comprising:

a central processing unit (CPU) to receive a first clock signal with a first frequency;

a receiver comprising a clock-and-data recovery (CDR) circuit to receive a plurality of phase signals to oversample an incoming signal; and a multi-phase generation circuit coupled to the receiver, wherein the multi-phase generation circuit is to:
receive the first clock signal;
generate a second clock signal with a second frequency lower than the first frequency; and
generate the plurality of phase signals using the first clock signal and the second clock signal.

11. The electronic device of claim 10, wherein the multi-phase generation circuit comprises a clock divider to generate the second clock signal and a phase generator to generate the plurality of phase signals, wherein the phase generator comprises:

a first shift register comprising a first number of flip-flops, wherein the first number of flip-flops is equal to 2N+1, where N is a positive integer greater than zero and corresponds to a division ratio of the clock divider, wherein the division ratio of the clock divider is equal to (2N+1)/2;

a second shifter register comprising the first number of flip-flops; and a plurality of multiplexers, wherein each output of the first number of flip-flops is coupled to either a first input or a second input of a respective one of the plurality of multiplexers, and wherein a number of multiplexers is equal to the first number.

12. The electronic device of claim 10, wherein the multi-phase generation circuit comprises:

a first flip-flop to receive the second clock signal, wherein the first flip-flop is clocked by the first clock signal to generate a first sampled signal;

a second flip-flop to receive the second clock signal, wherein the second flip-flop is clocked by an inverse of the first clock signal to generate a second sampled signal; and a first multiplexer comprising a first input coupled to an output of the first flip-flop and a second input coupled to an output of the second flip-flop, wherein the first multiplexer is clocked by the inverse of the first clock signal to generate a first phase signal of the plurality of phase signals.

13. The electronic device of claim 12, wherein the multi-phase generation circuit further comprises:

a third flip-flop to receive the first sampled signal, wherein the third flip-flop is clocked by the inverse of the first clock signal to generate a third sampled signal;

a fourth flip-flop to receive the second sampled signal, wherein the fourth flip-flop is clocked by the first clock signal to generate a fourth sampled signal; and a second multiplexer comprising a first input coupled to an output of the fourth flip-flop and a second input coupled to an output of the third flip-flop, wherein the second multiplexer is clocked by the inverse of the first clock signal to generate a second phase signal of the plurality of phase signals.

14. The electronic device of claim 12, wherein the multi-phase generation circuit further comprises:

a third flip-flop to receive the first sampled signal, wherein the third flip-flop is clocked by the inverse of the first clock signal to generate a third sampled signal;

a fourth flip-flop to receive the second sampled signal, wherein the fourth flip-flop is clocked by the first clock signal to generate a fourth sampled signal; and a second multiplexer comprising a first input coupled to an output of the third flip-flop and a second input coupled to an output of the fourth flip-flop, wherein the second multiplexer is clocked by the first clock signal to generate a second phase signal of the plurality of phase signals.

15. The electronic device of claim 10, wherein the multi-phase generation circuit is an all-digital circuit.

* * * * *